(12) United States Patent
Radu et al.

(10) Patent No.: US 8,993,461 B2
(45) Date of Patent: Mar. 31, 2015

(54) METHOD FOR CURING DEFECTS IN A SEMICONDUCTOR LAYER

(75) Inventors: Ionut Radu, Crolles (FR); Christophe Gourdel, Saint Maximin (FR); Christelle Vetizou, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/560,659

(22) Filed: Jul. 27, 2012

(65) Prior Publication Data

US 2013/0026663 A1    Jan. 31, 2013

(30) Foreign Application Priority Data

Jul. 28, 2011    (FR) ...................................... 11 56906

(51) Int. Cl.
*H01L 21/00* (2006.01)
*H01L 21/762* (2006.01)
*H01L 21/265* (2006.01)
*H01L 21/324* (2006.01)

(52) U.S. Cl.
CPC .... H01L 21/76254 (2013.01); H01L 21/26513 (2013.01); H01L 21/324 (2013.01)
USPC ........... 438/795; 438/455; 438/487; 438/473; 257/E21.568

(58) Field of Classification Search
USPC .................................. 438/455, 458, 459, 473
See application file for complete search history.

(56) References Cited

U.S. PATENT DOCUMENTS

| | | | |
|---|---|---|---|
| 6,403,450 B1 | 6/2002 | Maleville et al. | 438/471 |
| 6,528,359 B2 * | 3/2003 | Kusumoto et al. | 438/151 |
| 6,607,969 B1 * | 8/2003 | Kub et al. | 438/458 |
| 6,713,323 B2 * | 3/2004 | Yamazaki et al. | 438/146 |
| 8,481,393 B2 * | 7/2013 | Koyama et al. | 438/311 |
| 2005/0196936 A1 | 9/2005 | Daval et al. | 438/455 |
| 2005/0280155 A1 | 12/2005 | Lee | 257/758 |
| 2006/0121657 A1 * | 6/2006 | Zhang | 438/166 |
| 2010/0059797 A1 | 3/2010 | Ngai et al. | 257/255 |
| 2010/0087045 A1 * | 4/2010 | Shimomura et al. | 438/458 |
| 2010/0184269 A1 | 7/2010 | Noda | 438/458 |
| 2011/0121366 A1 | 5/2011 | Or-Bach et al. | 257/204 |

FOREIGN PATENT DOCUMENTS

| | | |
|---|---|---|
| FR | 2 867 307 A1 | 9/2005 |
| KR | 10-20090037365 A | 4/2009 |
| KR | 10-20100085840 A | 7/2010 |

OTHER PUBLICATIONS

Search Report, application No. FR 1156906 (Feb. 2, 2012).

* cited by examiner

*Primary Examiner* — Thao X Le
*Assistant Examiner* — Gardner W Swan
(74) *Attorney, Agent, or Firm* — TraskBritt

(57) ABSTRACT

A method for curing defects associated with the implantation of atomic species into a semiconductor layer transferred onto a receiver substrate, wherein the semiconductor layer is thermally insulated from the receiver substrate by a low thermal conductivity layer having thermal conductivity that is lower than that of the transferred semiconductor layer. The method includes applying a selective electromagnetic irradiation to the semiconductor layer to heat that layer to a temperature lower than its temperature of fusion to cure defects without causing an increase in the temperature of the receiver substrate beyond 500° C.

19 Claims, 4 Drawing Sheets

METHOD FOR CURING DEFECTS IN A SEMICONDUCTOR LAYER

PRIORITY CLAIM

This application claims the benefit of the filing date of French Application Serial No. FR1156906, filed Jul. 28, 2011, for "METHOD FOR CONTROLLING THE DURATION OF TREATMENT IN TURBULENT FLOW FLASH DRYERS," the disclosure of which is hereby incorporated herein in its entirety by this reference.

BACKGROUND

The present invention relates to a method for curing defects in a semiconductor layer.

The SMARTCUT® method is widely employed in the methods for fabrication of semiconductor structures, for transferring a layer from a substrate referred to as donor to a substrate referred to as receiver.

Generally speaking, this method comprises a step for implantation of ion species into the donor substrate.

The implantation profile in the donor substrate is of the Gaussian type, with a peak in a plane corresponding to a plane at a certain depth with a maximum of implanted species, forming a fragilization region or embrittlement zone in the donor substrate.

The layer to be transferred is bounded between the surface of the donor substrate through which the implantation has been carried out and the fragilization region. The SMARTCUT® method subsequently comprises a step for assembling the donor substrate with the receiver substrate, the layer to be transferred being brought into contact with the receiver substrate. Then mechanical, thermal or other forces are applied in such a manner as to fracture the donor substrate along the fragilization region. The remainder of the donor substrate, which could be recycled and re-used, and the final semiconductor structure that comprises the receiver substrate and the transferred layer are separated.

After the transfer, however, defects are present in the transferred layer. These defects are the result of the implantation and formation of the fragilization region, as well as due to the fracture that has been carried out on the donor substrate. These defects can typically comprise defects in the crystal lattice of the transferred layer, together with residues of the implanted species, etc. Such defects are capable of altering the operation of the electronic devices formed in or on the transferred layer.

In order to cure these defects, a known solution is to apply to the semiconductor structure thus formed a thermal treatment at a high temperature. In this respect, reference is made to the U.S. Pat. No. 6,403,450, which describes a method for curing post-fracture defects that comprises an oxidation of the surface of the transferred layer followed by a thermal treatment at a temperature of around 1100° C. There are situations, however, in which it is not possible to apply a thermal treatment at such a high temperature. This is notably the case when the receiver substrate is a substrate having been previously processed so as to comprise electronic devices, interconnections, metallized regions, etc., which would be altered by the application of a thermal treatment at a high temperature, in other words, greater than around 500° C. This is also the case when the transferred layer itself cannot be exposed to high temperatures, such as, for example, when this layer comprises a PN junction that would be damaged if it were exposed to temperatures exceeding 800° C. (owing to the diffusion of the dopants in the layers forming the junction).

U.S. Patent Publication No. 2005/0280155 discloses one example of a method in which a semiconductor layer comprising a PN junction is transferred onto a receiver substrate comprising electronic devices and an interconnection region comprising metallized portions, where the transfer of the semiconductor layer may be carried out by the SMARTCUT® method. Such a receiver substrate must not be exposed to a high temperature. Thus, the application of a thermal treatment at a lower temperature, in other words, lower than around 500° C., or the application of conditioning processing steps not implementing any thermal treatment (polishing, etc.), so as to avoid damaging the receiver substrate, might not be sufficient to cure all of the defects in the transferred layer. This insufficient or incomplete curing of the defects compromises the operation of devices formed later on in or on the transferred layer. In particular, since the implantation notably has the effect of de-activating certain types of dopants, the PN junction that it contains risks no longer being operational.

The aim of the present invention is to overcome these problems and, more particularly, to provide a method for curing defects due to the implantation into the transferred layer, which does not risk damaging the receiver substrate, whatever the devices or functions present in the receiver substrate.

SUMMARY OF THE INVENTION

According to the invention, a method is provided for curing defects associated with the implantation of atomic species into a semiconductor layer transferred onto a receiver substrate, wherein the semiconductor layer is thermally insulated from the receiver substrate by a low thermal conductivity layer having thermal conductivity that is lower than that of the transferred semiconductor layer. The method comprises applying a selective electromagnetic irradiation to the semiconductor layer to heat that layer to a temperature lower than its temperature of fusion to cure defects without causing an increase in the temperature of the receiver substrate beyond 500° C.

The selective electromagnetic irradiation typically has a wavelength chosen such that only the transferred semiconductor layer absorbs the irradiation. A preferred type of selective electromagnetic irradiation is a pulsed-laser irradiation with a selected energy density and duration of pulses that provide the recited heating of the semiconductor layer.

The transferred semiconductor layer is generally made of silicon and has a wavelength of irradiation that is shorter than 360 nm. This allows the applied energy and the duration of the pulses to be chosen to heat the transferred layer to a temperature in the range between 800 and 1300° C.

The receiver substrate generally comprises at least one electronic device, one functionalized region or one metallized region thereon or therein. Thus, the transferred layer is advantageously a layer of silicon comprising an electrically functional portion and the low thermal conductivity layer comprises an oxide or nitride. The low thermal conductivity layer typically has a thickness in the range between 10 and 10000 nm. It is also possible in the present methods to provide the low thermal conductivity layer as a discontinuous layer.

The invention also relates to a method for fabrication of a semiconductor structure comprising a receiver substrate and a semiconductor layer. This method includes implanting atomic species into a donor substrate to create a fragilization region subjacent the semiconductor layer to be transferred, providing, on one of a donor substrate or receiver substrate or on both substrates, a low thermal conductivity layer whose thermal conductivity is lower than the thermal conductivity of the semiconductor layer, bonding of the donor and receiver substrates with the low thermal conductivity layer or layers therebetween, fracturing the donor substrate along the fragilization region to transfer the semiconductor layer onto the receiver substrate, and curing defects in the transfer layer by applying a selective electromagnetic irradiation to the semiconductor layer to heat that layer to a temperature lower than its temperature of fusion to cure defects without causing an increase in the temperature of the receiver substrate beyond 500° C.

In this method, a polishing of the transferred semiconductor layer surface is usually conducted after fracturing and before the curing of the defects. The bonding of the substrates is by molecular bonding. To facilitate such bonding, a bonding layer is associated on one of the donor substrate, the receiver substrate or on both substrates. The bonding layer(s) generally have a thermal conductivity greater than or equal to the thermal conductivity of the semiconductor layer. Suitable bonding layers comprise a layer of silicon or metal.

The invention also relates to a semiconductor structure comprising a substrate and a semiconductor layer, with the substrate comprising at least one electronic device, one functionalized region, or one metallized region thereon or therein that is thermally insulated from the semiconductor layer by a low thermal conductivity layer having a thermal conductivity lower than thermal conductivity of the semiconductor layer. In these substrates, the semiconductor layer may comprise a portion having a P-type donor concentration higher than $10^{17}$ $cm^{-3}$. Such structures are advantageously obtained by the method for curing defects according to the invention, which allows the P-type dopants contained in the semiconductor layer to be reactivated.

BRIEF DESCRIPTION OF THE DRAWINGS

Others features and advantages of the invention will become apparent from the detailed description that follows, presented with reference to the appended drawings in which.

It should be noted that, in the diagrams of the structures, the ratios of thicknesses between the various layers are not necessarily adhered to in order to facilitate their representation.

DETAILED DESCRIPTION OF THE INVENTION

FIGS. 1A to 1D illustrate the successive steps in the fabrication of a structure comprising a semiconductor layer 10 on a receiver substrate 2 by transfer of the layer 10 from a donor substrate 1.

Figure 1A:
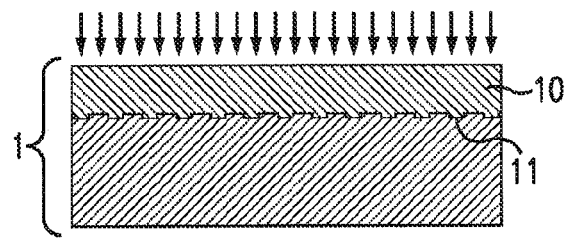
FIGS. 1A to 1D illustrate schematically the various steps for transferring a semiconductor layer onto a functionalized receiver substrate by the SMARTCUT® method.
Figure 1B:
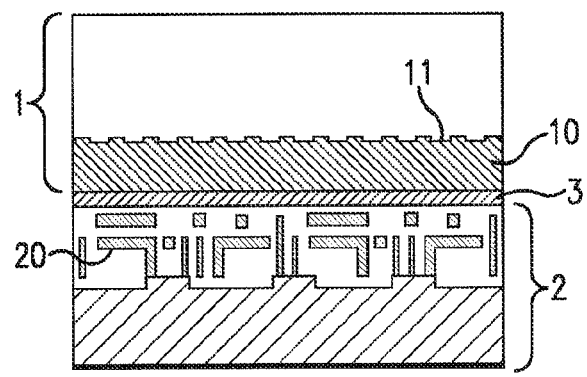

With reference to FIG. 1A, a fragilization region 11 is formed by implantation of species (schematically represented by the arrows) into the donor substrate 1 comprising the layer 11 to be transferred. The donor substrate 1 can be a bulk substrate or else a composite substrate, in other words composed of a stack of layers of various materials. The layer 11 to be transferred is a single-crystal layer of a semiconductor material, for example, silicon, germanium, SiGe, III-V binary, ternary, quaternary, or even higher order alloys. It may also be composed of a stack of such layers. For example, the transferred layer 10 can be a layer of silicon comprising a PN junction.

The implanted species are typically light atoms, such as, preferably, hydrogen or helium. A single species can be implanted (for example, hydrogen only), however, alternatively, a co-implantation of two species (for example, hydrogen+helium), simultaneously or successively, may be preferred. The species implanted into the donor substrate are distributed according to an implantation profile that typically has a Gaussian shape; the fragilization region 11 is located at the implantation peak. Those skilled in the art are familiar with the implantation doses and energies for forming the fragilization region 11 at a given depth (corresponding to the thickness of the layer 10 to be transferred) depending on the material of the donor substrate 1 and on the species to be implanted.

In a second step (FIG. 1B) the fragilized donor substrate 1 is bonded onto a receiver substrate 2. In this figure, the receiver substrate 2 is shown with functionalized regions 20, which may comprise metallized regions, interconnections, or conducting links. For this reason, the receiver substrate 2 must not be subjected to high temperatures in order to avoid any damage to these functionalities. Alternatively, the substrate 2 can be a bulk or composite substrate made of one or more materials, semiconductors or otherwise, according to the application of the final semiconductor structure, again having or containing functionalized regions that are exposed or that are embedded in the structure.

A low conductivity or thermally insulating layer 3, in other words, one whose thermal conductivity is lower than the thermal conductivity of the transferred semiconductor layer 10, is inserted between the transferred layer 10 and the receiver substrate 2. The layer 3 allows the receiver substrate 2 to be thermally isolated from the transferred layer 10, such that when the transferred layer 10 is heated up to a high temperature, lower than its temperature of fusion, the increase in temperature in the receiver substrate 2 remains lower than 500° C. Furthermore, the layer 3 allows the energy needed for the heating of the transferred layer 10 to be minimized, since this heating is confined to the transferred layer 10, which is relatively thin.

In order to fulfill these functions, the thermally insulating layer 3 advantageously has a thickness in the range between 10 and 10000 nm, preferably between 50 and 1000 nm. The layer 3 is advantageously composed of an oxide, for example, $SiO_2$. Of course, any other material whose thermal conductivity is lower than that of the material of the semiconductor layer 10 may be employed, including various oxides or nitrides such as $SiO_2$, $Al_2O_3$, SiN, $HfO_2$, $TiO_2$, etc.

The layer 3 can be uniform (formed from a single material or from a stack of layers) or non-uniform, in other words formed from complementary patterns, each of the patterns being formed from a thermally insulating material. The layer 3 may be continuous, in other words spread over the whole surface of the receiver substrate 2 or of the transferred layer 10. Alternatively (not shown), the layer 3 can be discontinuous, in other words, only formed from an insulating material over certain areas of the surface of the receiver substrate 2 or of the transferred layer 10, in particular facing areas of the receiver substrate 2 that must necessarily be maintained at a temperature lower than 500° C.

According to one particular embodiment, the layer 3 also constitutes a bonding layer formed between the donor substrate 1 and the receiver substrate 2. In particular, the bonding layer can allow the bonding energy between the two substrates 1, 2 to be increased. Thus, for example, if the donor substrate 1 and the receiver substrate 2 are made of silicon, the bonding layer can be a layer of $SiO_2$. The bonding layer may be formed before the bonding onto one of the substrates 1, 2 or else be composed of the assembly of two layers of oxide formed on each of the two substrates 1, 2.

Alternatively (not shown), a bonding layer separate from the thermally insulating layer can be formed on the donor substrate and/or the receiver substrate. For example, the bonding layer can comprise a layer of silicon.

According to another embodiment of the invention, the bonding layer can comprise a metal layer, notably when it is desired to form a conducting link between the transferred semiconductor layer 10 and the receiver substrate 2. Furthermore, the bonding layer may be continuous (in other words covering the whole surface of the substrates (donor 1 and receiver 2)) or else discontinuous, in other words only covering a part of the surface of the substrates 1, 2 the bonding layer then being laid out according to a given pattern.

When the bonding layer is not thermally insulating, in other words it has a thermal conductivity greater than or equal to the thermal conductivity of the transferred layer 10 (which is generally the case for a metal layer or for a layer of silicon), prior to the bonding, thermally insulating layer 3 is formed on or under the bonding layer. When the bonding layer has a temperature of fusion lower than the temperature of fusion of the transferred semiconductor layer 10 (which can be the case for a metal layer), it is preferable to place the thermally insulating layer 3 between the transferred semiconductor layer 10 and the bonding layer, in such a manner as to avoid a significant increase in temperature of the bonding layer during the heating of the transferred layer 10. Alternatively (not shown), a bonding, without the bonding layer, of the donor substrate 1 onto the receiver substrate 2 may be carried out, the thermally insulating layer 3 (continuous or discontinuous) being situated at the interface.

Preferably, the bonding is effected by molecular adhesion as is generally known in the art. The thermally insulating layer 3 and, where relevant, the bonding layer can be formed by any suitable method, for example by a deposition technique, such as a chemical vapor deposition (CVD), a physical vapor deposition (PVD), or an atomic layer deposition (ALD).

Optionally, the bonding step, whether or not it involves the use of a bonding layer, can be preceded by treatment or processing steps on the surface of the donor substrate 1 and/or of the receiver substrate 2 designed to increase the bonding energy. Such processing or treatment steps may notably comprise operations for cleaning, chemical etching, polishing, plasma activation, etc.

The bonding may be followed by a thermal treatment designed to reinforce the bonding. Given that the receiver substrate 2 cannot tolerate high temperatures, this thermal treatment will be conducted at a moderate temperature, for example, less than or equal to 500° C.

Figure 1C:
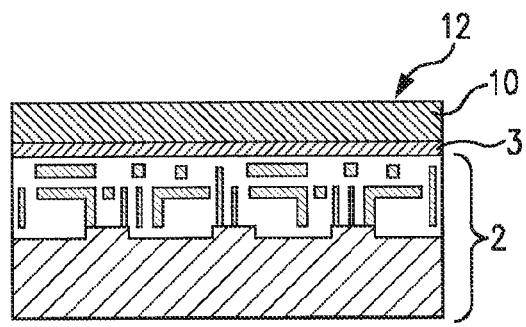

Subsequently, the donor substrate 1 is caused to fracture along the fragilization region 11 and, after separation from the remainder of the donor substrate 1, the structure illustrated in FIG. 1C is obtained comprising the donor substrate 2, potentially the bonding layer and the transferred semiconductor layer 10. Since the surface 12 of the transferred layer 10 exhibits a certain roughness after the fracture, it may be advantageous to polish it, for example, by a chemical-mechanical polishing (CMP) process, in order to reduce its roughness.

Figure 1D:
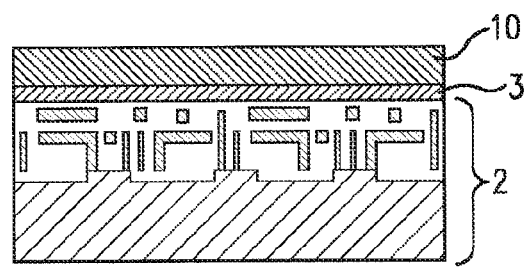

With reference to FIG. 1D, a thermal treatment is applied that is localized to the transferred layer 10, in other words, that does not lead to the rest of the structure being significantly heated. The aim of the thermal treatment is to cure the defects in the transferred layer 10 that are associated with the implantation, without causing the transferred layer 10 to melt. For example, when the transferred layer 10 is a layer of silicon comprising one or more p-n junctions, the effect of the implantation is to electrically deactivate the dopants used to form the junction. Notably, it is known that the implantation of hydrogen leads to a doping of the n type for a layer of silicon. Such a doping can degrade the electrical performance of the layer, in particular if the initial doping of the layer is of the p type, or if the layer comprises a portion having a p-type doping, which is the case in a junction.

Thanks to the treatment according to the invention, the curing of the defects associated with the implantation and with the fracture allows the dopants to be reactivated. In contrast to thermal treatments of the prior art, which lead to a heating of the whole of the semiconductor structure, the invention provides a localized thermal treatment of the transferred layer, avoiding the heating of the receiver substrate, or at the very least to heat it in a sufficiently moderated manner so as not to alter the devices or functions that it comprises (this also applying, where relevant, to the bonding layer if it is sensitive to temperature). For this purpose, the solution of the invention is to apply an electromagnetic irradiation by pulses to the transferred layer. The parameters of this irradiation are presented in detail hereinbelow.

Parameters of the Irradiation

Wavelength

The wavelength of the irradiation is chosen such that the radiation is totally or substantially totally absorbed by the transferred layer 10. This allows the heating caused by the irradiation to be localized at the transferred layer 10 and the temperature of the receiver substrate 2 to remain below a temperature beyond which the devices or functions that it comprises would be altered. As previously mentioned, when the bonding layer has a temperature of fusion lower than the temperature of fusion of the transferred semiconductor layer 10 (which can be the case for a metal layer), it is preferable to place the thermally insulating layer 3 between the transferred semiconductor layer 10 and the bonding layer, in such a manner that the bonding layer is raised to a temperature substantially lower than its temperature of fusion.

Furthermore, the radiation absorbed by the transferred layer 10 must lead to a temperature of the transferred layer 10 that remains below the temperature of fusion of the layer 10. Indeed, during this treatment, this solution tries to avoid melting the transferred layer 10 so as not to risk the generation of the crystal defects in the layer 10 that would be due to a mechanism of fusion re-crystallization. Such defects would be likely to deteriorate the electrical performance of the transferred layer 10.

Figure 2:
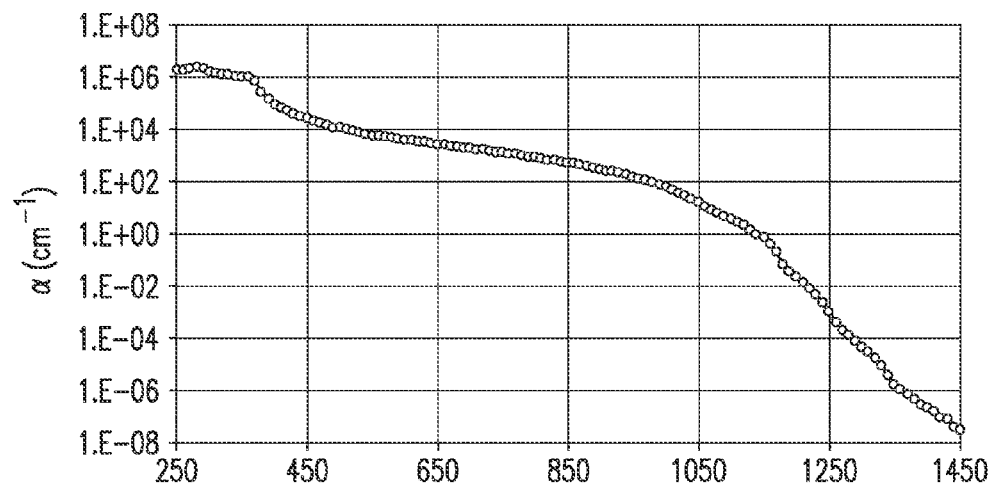
FIG. 2 shows the curve of the coefficient of absorption in silicon as a function of the wavelength of the radiation.

FIG. 2 illustrates the curve of the coefficient of absorption a in silicon as a function of a wavelength λ. It can be deduced from this curve that, in order to avoid the radiation being transmitted to the receiver substrate, the wavelength of the laser must be shorter than 360 nm. This is because, beyond 360 nm, the coefficient of absorption decreases, which means that the radiation passes through the transferred layer to reach the underlying layers and to heat them up.

Duration of the Pulses

The duration of the pulses is chosen so as, on the one hand, to be sufficiently long to provide the energy that is sufficient to cure the defects due to the implantation into the transferred layer 10 and, on the other hand, sufficiently short so as not to produce a significant increase in the temperature of the receiver substrate 2. In addition, the time interval between two pulses is chosen to be longer than the time needed for diffusing the heat in the silicon. For example, if the receiver substrate 2 comprises a metallized region, the increase in temperature must not exceed the temperature of fusion of the metal. Typically, for a transferred layer 10 whose thickness is of the order of a micrometer, the order of magnitude of the duration of the pulse is around ten nanoseconds. By way of example, the lasers currently on the market offer pulse durations in the range between 10 and 200 ns.

Power

The power delivered by the laser must theoretically be sufficient to allow the transferred layer 10 to be heated during each pulse. In practice, it is possible to focus the laser beam such that the energy per unit surface area delivered reaches the required level. The only limitation of this focusing technique is the size of the focus spot, which, if it is very small, has a negative effect on the efficiency of the method. One notable advantage of thermally insulating layer 3 (whether continuous or discontinuous) is that it allows the energy provided by the laser to be confined only to the transferred layer 10 whose thickness is small with respect to the total thickness of the structure. This allows a laser with a moderate power to be used, which is in any respect readily accessible with the industrial devices currently present on the market.

Example

Figure 3:
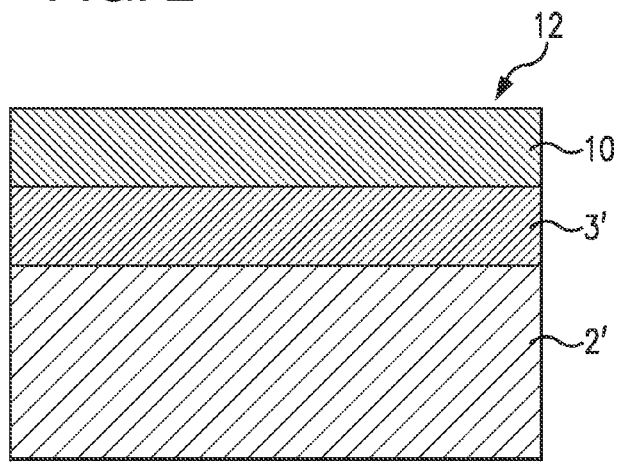
FIG. 3 illustrates a structure of the semiconductor-on-insulator type obtained by the SMARTCUT® method.

The silicon-on-insulator (SaI) structure illustrated in FIG. 3 is fabricated by the SMARTCUT® method, which structure successively comprises a receiver substrate 2' made of bulk silicon, whose thickness is a few hundreds of micrometers, a thermally insulating bonding layer 3' of silicon dioxide having a thickness of 145 nm (referred to as a BOX, acronym for the term "Buried OXide"), and a transferred layer 10 of single-crystal silicon having a thickness of 0.8 μm. The conditions used for the fabrication of this structure SOT are a hydrogen implantation with an energy of 122 keV and a dose of $8 \times 10^{16}$ at/cm$^2$.

After the fracture, the transferred layer 10 of silicon is damaged by defects associated with the implantation and with the fracture. A large part of these defects is eliminated by the application of a chemical-mechanical polishing (CMP), but the residual defects degrade the crystallinity of the silicon and are detrimental to the performance of the electronic devices that are subsequently to be formed in or on the transferred layer 10.

An irradiation by laser is applied to two identical semiconductor structures. The first treatment step is an irradiation with a laser marketed by the company JPSA, with a wavelength of 19:3 nm and a pulse duration of 20 ns FWHM (Full-Width Half-Max). The second treatment is an irradiation with a laser marketed by the company EXCICO®, with a wavelength of 308 nm and a pulse duration of 160 ns FWHM. In order to heat a surface portion (in other words localized at the transferred layer 10) of the semiconductor structure to a temperature lower than the temperature of fusion of the silicon, the energy per unit surface area of the lasers is respectively limited to 0.16 J/cm$^2$ for the first laser and to 0.7 J/cm$^2$ for the second.

Simulations, which consist of the resolution of the heat equation for transient conduction in a multilayer and take into account the transient nature of the pulsed laser, can be developed. Results of these simulations are presented in FIGS. 4A and 4B, which show the temperature profiles in each of the layers 10, 3', 2' of the semiconductor structure at various times. The abscissa axis shows the depth in the structure, the origin corresponding to the free surface 12 of the transferred semiconductor layer 10.

Figure 4A:
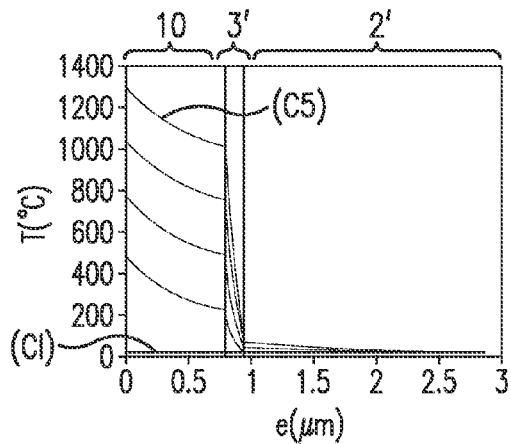
FIGS. 4A and 4B respectively show the temperature profiles in the structure in FIG. 3 with a JPSA laser and with an EXCICO® laser as a progression of the successive pulses.
Figure 4B:
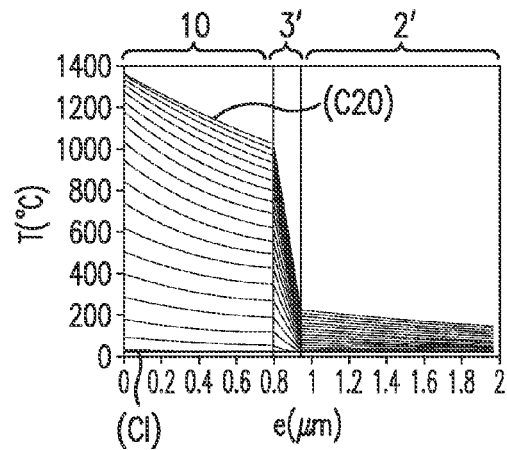

FIG. 4A shows the temperature profiles in the semiconductor structure in the case of the first treatment; curves (c1) to (c5) show the increase in the temperature every 5 ns until the end of the laser pulse. FIG. 4B shows the temperature profiles in the semiconductor structure in the case of the second treatment; the curves (c1) to (c20) show the increase in the temperature every 10 ns until the end of the laser pulse.

In the two cases, it can be observed that, even at these relatively low power levels, the heating is confined to the transferred semiconductor layer 10 and that it is possible to reach, in a few pulses, a temperature close to but lower than the temperature of fusion of silicon, suitable for curing the defects associated with the implantation. On the other hand, even if over time heating of the receiver substrate 2' takes place, this heating does not exceed 200° C. These same simulations also allow the time variation of the temperature of the surface of the various layers during one pulse to be observed in the structure illustrated in FIG. 1

Figure 5A:
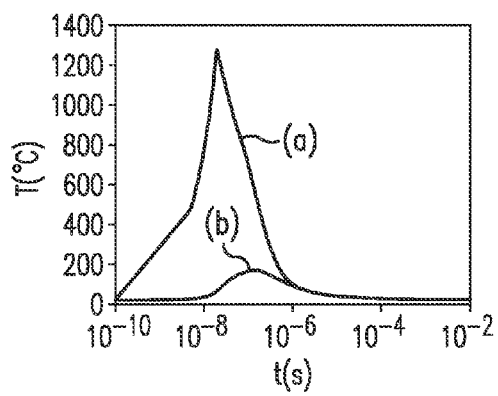
FIGS. 5A and 5B show the variation over time of the temperature at the surface of the transferred semiconductor layer (curve (a)) and of the receiver substrate (curve (b)) for the structure in FIG. 3 with a JPSA laser and with an EXCICO® laser, respectively.
Figure 5B:
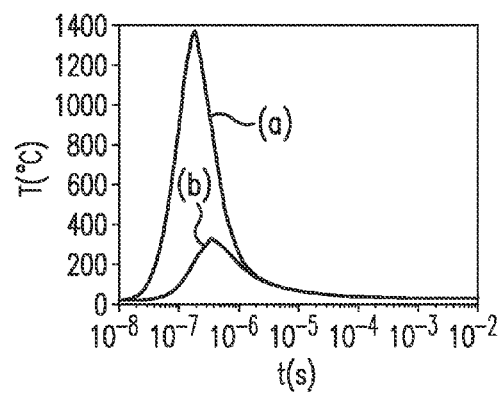

FIGS. 5A and 5B show the variation of the temperature at the surface of the transferred layer 10 (curve (a)) and at the interface between thermally insulating layer 3' and the receiver substrate 2' (curve (b)), in the case of the first treatment and of the second treatment, respectively. In the two cases, it is verified that the temperature of the surface of the receiver substrate never exceeds 500° C. In the first case, this temperature does not even exceed 200° C. For a given pair of thicknesses of the transferred layer 10 and of the bonding layer 3', the power density needed to obtain a temperature at the interface between the air and the transferred layer 10 lower than the temperature of fusion of the layer 10 can be adjusted in the simulation.

Figure 6:
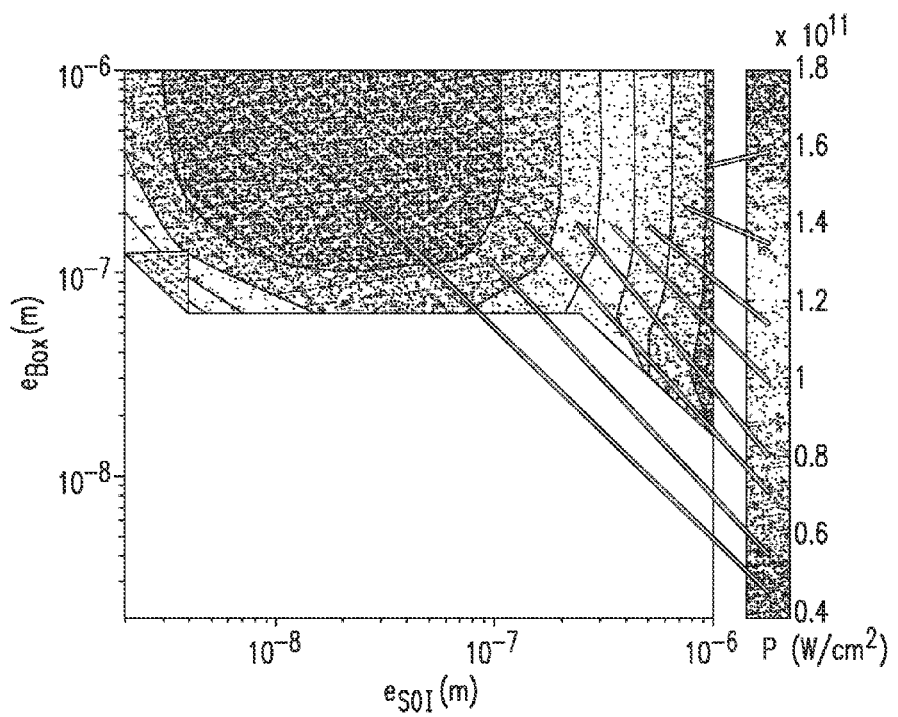
FIG. 6 illustrates a cartography of the power density of the laser as a function of the thickness of the transferred layer and of the thickness of the bonding layer.

By scanning a range of thicknesses of the transferred layer 10 and of the bonding layer 3', the cartography illustrated in FIG. 6 is obtained. FIG. 6 shows a cartography of the power density of the laser as a function of the thickness $e_{SOI}$ of the transferred layer 10 (on the abscissa) and of the thickness $e_{BOX}$ of the thermally insulating layer 3' (on the ordinate), in the case of the first treatment (JPSA laser). The parameters of the treatment are defined in such a manner that the interface between the air and the transferred layer 10 is heated to a temperature very close to the temperature of fusion of the material of the layer, but lower than this temperature, whereas the interface between the thermally insulating layer 3' and the receiver substrate 2' remains at a temperature lower than 400° C., The lower shaded part of the cartography is a region in which the treatment leads to an increase in the temperature of the interface between the thermally insulating layer 3' and the receiver substrate 2' greater than 400° C.

FIG. 6 highlights the efficiency of the layer 3' of $SiO_2$ in terms of thermal insulation of the receiver substrate 2' with respect to the transferred layer 10. This figure also shows that, in certain configurations of thicknesses of the transferred layer 10 (5 nm to 200 nm) and of thermally insulating layer 3' (greater than 50 nm), a relatively modest power density (of around $0.4.10^{11}$ W/cm$^2$) allows a relatively high temperature to be reached on the surface 12 of the layer 10 without exceeding 400° C. in the receiver substrate. On the upper part of the cartography, various regions can be seen that correspond to various values of the required power density, which is in the range between $0.4.10^{11}$ W/cm$^2$ and $1.8.10^{11}$ W/cm$^2$ and which may, for example, be represented by various colors.

Generally speaking, the greater the thickness of thermally insulating layers 3, 3', the lower the energy that must be provided by the laser for heating the surface of the transferred layer 10 to the required temperature. If the thermally insulating layers 3, 3' were too thin, it would not be possible to raise the surface of the transferred layer 10 to a high temperature lower than the temperature of fusion of the silicon while maintaining the interface of the layer 10 with the receiver substrate 2 at a temperature lower than 500° C. Finally, when the transferred layer 10 is very thin (of the order of a nanometer), the optical length is small, which requires a higher power beam to reach the temperature for curing the defects lower than the temperature of fusion of the silicon.

The curing of the defects by laser treatment can be observed by various techniques. In particular, Raman spectroscopy allows the crystallinity of the transferred layer 10 to be characterized by means of the width of the peak at half-height (FWHM).

Figure 7:
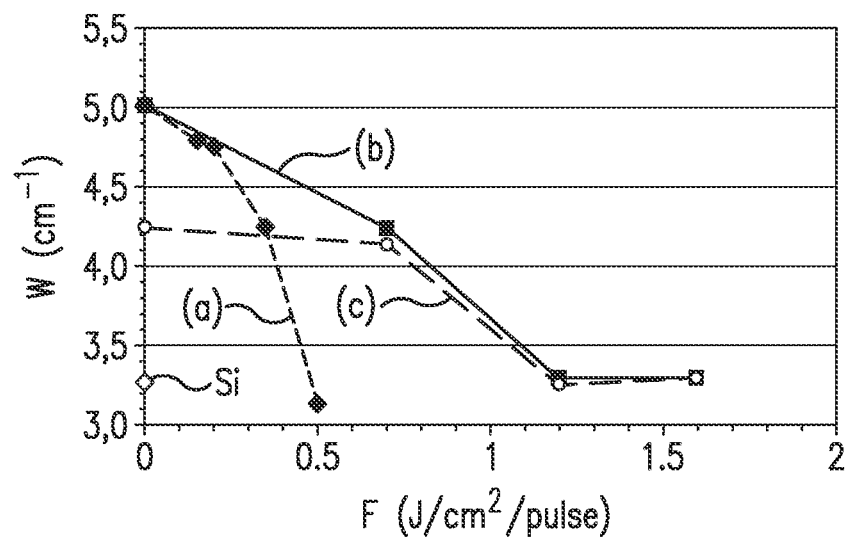
FIG. 7 shows the variation of the width of the Raman peak as a function of the energy density of the laser for various structures treated by laser or otherwise.

FIG. 7 illustrates the improvement in the crystallinity of the silicon of the transferred layer 10 as a function of the energy density F of the laser, the ordinate axis being the width W ($cm^{-1}$) of the peak at half-height for the Raman UV spectroscopy. The curve (a) corresponds to the first laser treatment applied to the semiconductor structure in FIG. 3 in which H+ ions had been implanted through the layer 10 to be transferred. The curve (b) corresponds to the second laser treatment applied to the semiconductor structure in FIG. 3 in which H+ ions had been implanted through the layer 10 to be transferred. The curve (c) corresponds to the second laser treatment applied to the semiconductor structure in FIG. 3 in which an He/H+ co-implantation had been carried out through the layer 10 to be transferred.

It is observed that the crystalline quality increases (i.e., the width of the peak decreases) when the energy density of the laser increases. Thus, for a high energy density, in the transferred layer, a crystalline quality similar to that of bulk silicon (reference material represented by the point Si) and to that of a layer of silicon in an SOI having undergone a thermal treatment at a temperature higher than 1000° C. is obtained.

Figure 8:
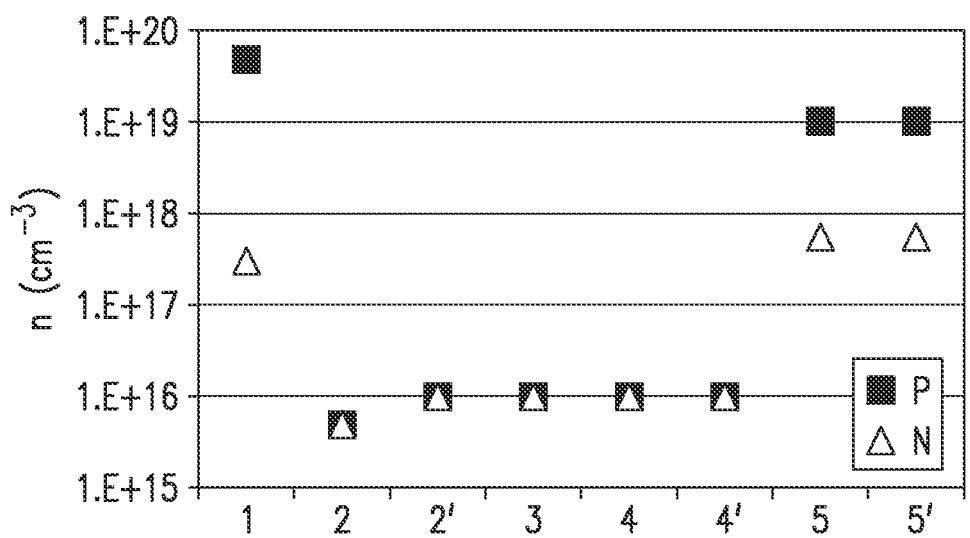
FIG. 8 illustrates the variation of the dopant concentration of the transferred semiconductor layer through the various steps of the method.

FIG. 8 illustrates the restoration of the activation of the dopants in the case where the transferred layer is a layer of silicon comprising a PN junction. In this graph, the ordinate axis corresponds to the level of doping n (expressed in $cm^{-3}$) in the transferred layer. The squares correspond to the P doping, the triangles to the N doping. The abscissae correspond to the successive implantation, fracture and curing steps for the defects by the laser irradiation, Prior to the implantation (step 1), the N doping is at a density of around $5 \times 10^{17}$ $cm^{-3}$, whereas the P doping is around $8 \times 10^{19}$ $cm^{-3}$. The implantation, whether this be implantation of H+ ions (step 2) or co-implantation of He/H+ ions (step 2'), has the effect of de-activating the dopants, which results in a significant decrease in the level of doping n.

This de-activation is also observed after fracture (step 3 corresponding to the fracture preceded by the implantation of H+ or step 3' corresponding to the fracture preceded by the H+/He co-implantation) and after polishing (step 4 corresponding to the polishing of the transferred layer having undergone the implantation of H+ or step 4' corresponding to the polishing of the transferred layer having undergone H+/He co-implantation).

The laser treatment has the effect of restoring the dopants. Thus, step 5 consists in applying a laser treatment with an energy density of 0.65 J/cm$^2$ to the transferred layer having undergone the implantation of H+. The step 5' relates to the same laser treatment applied to the transferred layer having undergone H+/He co-implantation.

The invention therefore allows a structure to be obtained in which the transferred semiconductor layer comprises a portion having a P-type donor concentration greater than $10^{17}$ $cm^{-3}$, which could not be obtained with the methods of the prior art when it was not possible to expose the receiver substrate to a temperature higher than 500° C.

Lastly, it goes without saying that the examples that have just been presented are only particular illustrations and are in no way limiting with regard to the fields of application of the invention, notably as regards the nature and the materials of the semiconductor structure treated. In particular, the invention is advantageously applicable to semiconductor structures fabricated by the SMARTCUT® method in which the receiver substrate must not be exposed to temperatures that are too high. A skilled artisan would immediately recognize that the invention is also applicable to structures whose receiver substrate is not subject to such limitations; for example, a "conventional" SOI structure in which the receiver substrate is, for example, a bulk silicon substrate.

What is claimed is:

1. A method for curing defects associated with the implantation of atomic species into a semiconductor layer transferred onto a receiver substrate, the semiconductor layer comprising silicon and being thermally insulated from the receiver substrate by a low thermal conductivity layer having thermal conductivity that is lower than that of the transferred semiconductor layer, wherein the method comprises:

applying a selective electromagnetic irradiation to the semiconductor layer to heat that layer to a temperature lower than its temperature of fusion to cure defects without causing the transferred semiconductor layer to melt and without causing an increase in the temperature of the receiver substrate beyond 500° C., wherein the selective electromagnetic irradiation is a pulsed-laser irradiation that has a selected energy density and duration of pulses so that only the transferred semiconductor layer absorbs the irradiation, the energy and the duration of the pulses are chosen so as to heat the transferred layer to a temperature in the range between 800 and 1300° C., and the time interval between two pulses is chosen to be longer than the time needed for diffusing heat in the semiconductor layer.

2. The method according to claim 1, wherein the transferred semiconductor layer is made of silicon and has a wavelength of irradiation that is shorter than 360 nm.

3. The method according to claim 1, wherein the receiver substrate comprises at least one electronic device, one functionalized region or one metallized region thereon or therein.

4. The method according to claim 1, wherein the transferred layer is a layer of silicon comprising an electrically functional portion and the low thermal conductivity layer comprises an oxide or nitride.

5. The method according to claim 1, wherein the low thermal conductivity layer has a thickness in the range between 10 and 10000 nm.

6. The method according to claim 1, wherein the semiconductor layer comprises a portion having a P-type donor dopant concentration higher than $10^{17}$ cm$^3$.

7. The method according to claim 6, wherein the selective electromagnetic irradiation is applied in a manner that also reactivates the P-type donor dopants.

8. The method according to claim 1, wherein the selective electromagnetic irradiation is applied to the semiconductor layer to heat that layer to a temperature lower than its temperature of fusion to cure defects without causing an increase in the temperature of the receiver substrate beyond 200° C.

9. A method for fabrication of a semiconductor structure comprising a receiver substrate and a semiconductor layer, which method comprises:

implanting atomic species into a donor substrate comprising silicon to create a fragilization region subjacent the semiconductor layer to be transferred, providing, on one of a donor substrate or receiver substrate or on both substrates, a low thermal conductivity layer whose thermal conductivity is lower than thermal conductivity of the semiconductor layer, bonding of the donor and receiver substrates with the low thermal conductivity layer or layers therebetween, fracturing the donor substrate along the fragilization region to transfer the semiconductor layer comprising silicon onto the receiver substrate, and curing defects in the transferred semiconductor layer by applying a selective electromagnetic irradiation to the semiconductor layer to heat that layer to a temperature lower than its temperature of fusion to cure defects without causing the transferred semiconductor layer to melt and without causing an increase in the temperature of the receiver substrate beyond 500° C., wherein the selective electromagnetic irradiation is a pulsed-laser irradiation that has a wavelength that is shorter than 360 nm with a selected energy density and duration of pulses so that only the transferred semiconductor layer absorbs the irradiation, the energy and the duration of the pulses are chosen so as to heat the transferred layer to a temperature in the range between 800 and 1300° C., and the time interval between two pulses is chosen to be longer than the time needed for diffusing heat in the semiconductor layer.

10. The method according to claim 9, which further comprises conducting a polishing of the transferred semiconductor layer surface after fracturing and before the curing of the defects.

11. The method according to claim 9, wherein the bonding is molecular bonding.

12. The method according to claim 9, which further comprises associating a bonding layer on one of the donor substrate, the receiver substrate or on both substrates to facilitate bonding, wherein the bonding layer(s) have a thermal conductivity greater than or equal to that of the semiconductor layer.

13. The method according to claim 12, wherein the bonding layer comprises a layer of silicon or metal.

14. The method according to claim 9, wherein the low thermal conductivity layer is discontinuous.

15. The method according to claim 9, wherein the transferred semiconductor layer is made of silicon and has a wavelength of irradiation that is shorter than 360 nm.

16. The method according to claim 9, wherein the transferred semiconductor layer is a layer of silicon comprising an electrically functional portion and the low thermal conductivity layer comprises an oxide or nitride.

17. The method according to claim 9, wherein the semiconductor layer comprises a portion having a P-type donor dopant concentration higher than $10^{17}$ cm$^{-3}$.

18. The method according to claim 17, wherein the selective electromagnetic irradiation is applied in a manner that also reactivates the P-type donor dopants.

19. The method according to claim 9, wherein the selective electromagnetic irradiation is applied to the semiconductor layer to heat that layer to a temperature lower than its temperature of fusion to cure defects without causing an increase in the temperature of the receiver substrate beyond 200° C.

* * * * *